US 6,627,021 B2

(12) United States Patent
Tatsukawa et al.

(10) Patent No.: US 6,627,021 B2
(45) Date of Patent: Sep. 30, 2003

(54) METHOD OF MANUFACTURING LAMINATED CERAMIC ELECTRONIC COMPONENT AND METHOD OF MANUFACTURING LAMINATED INDUCTOR

(75) Inventors: Tsuyoshi Tatsukawa, Shiga-ken (JP); Hiromichi Tokuda, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 64 days.

(21) Appl. No.: 10/077,786

(22) Filed: Feb. 20, 2002

(65) Prior Publication Data

US 2002/0144765 A1 Oct. 10, 2002

(30) Foreign Application Priority Data

Apr. 6, 2001 (JP) ......................................... 2001-108739

(51) Int. Cl.[7] ............................ B32B 31/26; B65B 9/00; H01F 41/10

(52) U.S. Cl. ................. 156/89.12; 156/89.16; 156/233; 156/235

(58) Field of Search ........................ 156/89.12, 89.16, 156/233, 235

(56) References Cited

U.S. PATENT DOCUMENTS

| 4,753,694 | A  | * | 6/1988  | Herron et al. ........... 156/89.18 |
| 5,009,744 | A  | * | 4/1991  | Mandai et al. .................. 216/6 |
| 5,046,236 | A  | * | 9/1991  | Wada et al. ................ 29/610.1 |
| 5,412,865 | A  | * | 5/1995  | Takaoka et al. ............... 29/830 |
| 5,700,338 | A  | * | 12/1997 | Kubodera et al. ........ 156/89.16 |
| 6,007,652 | A  | * | 12/1999 | Hosokawa et al. ....... 156/89.16 |
| 6,255,932 | B1 | * | 7/2001  | Kubodera et al. ........... 336/200 |
| 6,544,365 | B2 | * | 4/2003  | Tokuda et al. .............. 156/89.2 |
| 6,551,426 | B2 | * | 4/2003  | Okuyama et al. ......... 156/89.12 |
| 2002/0105052 | A1 | * | 8/2002 | Tokuda et al. .............. 257/531 |

FOREIGN PATENT DOCUMENTS

JP            9-237955         *   9/1997

* cited by examiner

*Primary Examiner*—Curtis Mayes
(74) *Attorney, Agent, or Firm*—Keating & Bennett, LLP

(57) ABSTRACT

A method of manufacturing a laminated ceramic electronic component includes the steps of forming a conductor having a large thickness, which includes a plurality of first coil conductor layers and a plurality of second conductor layers, transferring the plurality of first coil conductor layers, which are each provided on a carrier film, onto the upper surface of a ceramic green sheet, and transferring the plurality of second coil conductor layers, which are each held on a carrier film, onto the lower surface of the same ceramic green sheet.

16 Claims, 7 Drawing Sheets

METHOD OF MANUFACTURING LAMINATED CERAMIC ELECTRONIC COMPONENT AND METHOD OF MANUFACTURING LAMINATED INDUCTOR

BACKGROUND OF THE INVENTION

1. Field of the Invention

The present invention relates to a method of manufacturing a laminated ceramic electronic component for use as, for example, an inductor, an LC component, a laminated capacitor, a laminated circuit module or other suitable electronic component. More particularly, the present invention relates to a method of manufacturing a laminated ceramic electronic component which has an internal conductor and an internal electrode (hereinafter collectively referred to as the internal conductor), and to a method of manufacturing such a laminated inductor having an internal electrode with a greatly increased thickness.

2. Description of the Related Art

Known laminated inductors are formed by using a sintered body obtained by integrally sintering a metal and a ceramic. When manufacturing the known laminated inductor, a through hole is formed in a ceramic green sheet for electrically connecting one internal electrode provided on the ceramic green sheet to another internal electrode provided under the same ceramic green sheet. Then, internal electrode paste for forming a coil conductor is printed on the ceramic green sheet. The plurality of ceramic green sheets obtained in the above-described manner is laminated, and a suitable number of plain ceramic green sheets are laminated on the top and bottom surfaces thereof. Accordingly, a green laminated body is obtained and is compressed in the thickness direction. Then, by sintering the compressed green laminated body, a ceramic sintered body is obtained. On the outer surface of the ceramic sintered body, a pair of external electrodes is provided and is electrically connected to the coil conductor.

When using the laminated inductor, the number of windings of the coil conductor can be increased by increasing the number of laminated ceramic green sheets. Accordingly, a large inductance is obtained.

To reduce the series resistance of the laminated inductor, it is necessary to increase either the thickness or the width of the coil conductor. However, when applying the above-described method for forming an internal electrode such as a coil conductor where internal electrode paste is screen-printed on a ceramic green sheet, it is difficult to form an internal electrode having a large thickness by one printing process.

Further, when the width of the coil conductor is increased to reduce the series resistance, the inductance deteriorates.

The above-described problems are common to known laminated ceramic electronic components such as a laminated ceramic capacitor, other than the laminated inductor.

SUMMARY OF THE INVENTION

In order to overcome the above-described problems, preferred embodiments of the present invention provide a method of manufacturing a laminated ceramic electronic component having an internal conductor with greatly increased thickness.

Preferred embodiments of the present invention provide a method of manufacturing a laminated inductor, which has a coil conductor that functions as an internal electrode and that has thickness which is easily increased, and in which a large inductance and a low series resistance is obtained.

According to a preferred embodiment of the present invention, a method of manufacturing a laminated ceramic electronic component includes the steps of preparing a first ceramic green sheet, at least one second ceramic green sheet, and transfer materials each having a conductor layer on one surface of a carrier film, transferring the plurality of conductor layers onto at least one of the upper surface and the lower surface of the first ceramic green sheet such that the conductor layers overlay one another to form a conductor having the plurality of conductor layers, laminating at least one second ceramic green sheet onto the conductor to form a green laminated body, and firing the green laminated body to form a sintered body.

Generally, when a conductor is formed on a carrier film by a known method such as screen printing, the thickness of the obtained conductor is about 200 $\mu$m. On the other hand, a conductor obtained according to the above-described preferred embodiment of the present invention includes a plurality of conductor layers. Subsequently, a laminated ceramic electronic component, which includes a conductor having a low series resistance and which achieves a large inductance and a large current-carrying capacity, is provided.

Preferably, in the method of manufacturing a laminated ceramic electronic component, one of the first ceramic green sheet and the second ceramic green sheet is formed as a composite sheet. The composite sheet may have a connecting conductor that penetrates both surfaces thereof, and the other may be a plain ceramic green sheet. By using the first ceramic green sheet and the second ceramic green sheet, a conductor which includes the plurality of conductor layers that is electrically connected to the connecting conductor of the composite sheet is formed. Subsequently, a laminated ceramic electronic component which has the conductor in a ceramic sintered laminated body formed with the second ceramic green sheets is provided.

According to another preferred embodiment of the present invention, a method of manufacturing a laminated ceramic electronic component includes the steps of preparing at least one ceramic green sheet, a composite sheet having a connecting conductor that penetrates both surfaces of a ceramic green sheet, and transfer materials each having a conductor layer that is to be connected to the connecting conductor on one surface of a carrier film, transferring the plurality of conductor layers onto the composite sheet such that the conductor layers overlay one another to form a conductor which is connected to the connecting conductor and which has the plurality of conductor layers, laminating the at least one ceramic green sheet onto the conductor to form a green laminated body and firing the green laminated body to form a sintered body. Subsequently, a conductor which has a large thickness and which is electrically connected to the connecting conductor is formed, as in the previous preferred embodiment of the present invention described above. Accordingly, as in the previous preferred embodiment, a laminated ceramic electronic component which includes a conductor having a low series resistance and which achieves a large inductance and a large current-carrying capacity is provided.

Preferably, the method of manufacturing a laminated ceramic electronic component further includes the step of laminating the conductor on the upper surface and the lower surface of the composite sheet such that one of these conductors is electrically connected to the upper portion of the connecting conductor and the other conductor is electrically connected to the lower portion of the connecting conductor. Subsequently, the conductors on the upper and lower surface of the composite sheet are electrically connected via the connecting conductor.

According to another preferred embodiment of the present invention, a method of manufacturing a laminated ceramic electronic component includes the steps of preparing a plurality of first ceramic green sheets, a second ceramic green sheet having a connecting conductor that penetrates both surfaces thereof, a plurality of transfer materials each having a conductor layer on one surface of a carrier film, transferring one of the conductor layers onto one surface of one of the first ceramic green sheets by applying pressure, and transferring the other conductor layer thereon by applying pressure such that the conductor layers overlay one another, laminating the second ceramic green sheet onto the conductor layers that are transferred onto the first ceramic green sheet such that the connecting conductor is connected to the conductor layers, transferring the other conductor layer onto the second ceramic green sheet by applying pressure such that the connecting conductor is connected to the conductor layer, and transferring the other conductor layer thereon by applying pressure such that the conductor layers overlay one another, and laminating the other first ceramic green sheet onto the second ceramic green sheet to form a green laminated body and firing the green laminated body to form a sintered body.

According to another preferred embodiment of the present invention, a method of manufacturing a laminated inductor includes the steps of preparing a composite sheet having a connecting conductor that penetrates both surfaces of a ceramic green sheet, transfer materials each having a coil conductor layer that is to be connected to the connecting conductor on one surface of a carrier film, and at least one plain ceramic green sheet, transferring the plurality of coil conductor layers onto the composite sheet such that the coil conductor layers overlay one another to form a coil conductor which is electrically connected to the connecting conductor and which has the plurality of coil conductor layers, laminating the at least one plain ceramic green sheet onto the coil conductor to form a green laminated body, and firing the green laminated body to form a sintered body. Accordingly, a laminated inductor which includes a coil conductor having a large thickness and which achieves a low series resistance and a large inductance is provided.

Preferably, the method of manufacturing a laminated inductor further includes the steps of transferring the plurality of coil conductor layers of the transfer materials onto the upper surface of the composite sheet and transferring the other plurality of coil conductor layers of the transfer materials onto the lower surface of the composite sheet. Subsequently, a first coil conductor is formed on the connecting conductor and a second coil conductor is formed under the connecting conductor. Since the first conductor and the second conductor are electrically connected via the connecting conductor, the obtained laminated inductor achieves an increased inductance.

Preferably, by the method of manufacturing a laminated inductor, the first coil conductor and the second coil conductor are formed to wind in the same direction. Accordingly, the obtained laminated inductor achieves a greatly increased inductance.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A method of manufacturing a laminated inductor according to a first preferred embodiment of the present invention will now be described with reference to FIG. 1, FIGS. 2A and 2B, FIG. 3, FIGS. 5A, 5B, 5C, 5D, 5E, and 5F, and FIG. 6.

Figure 2A:
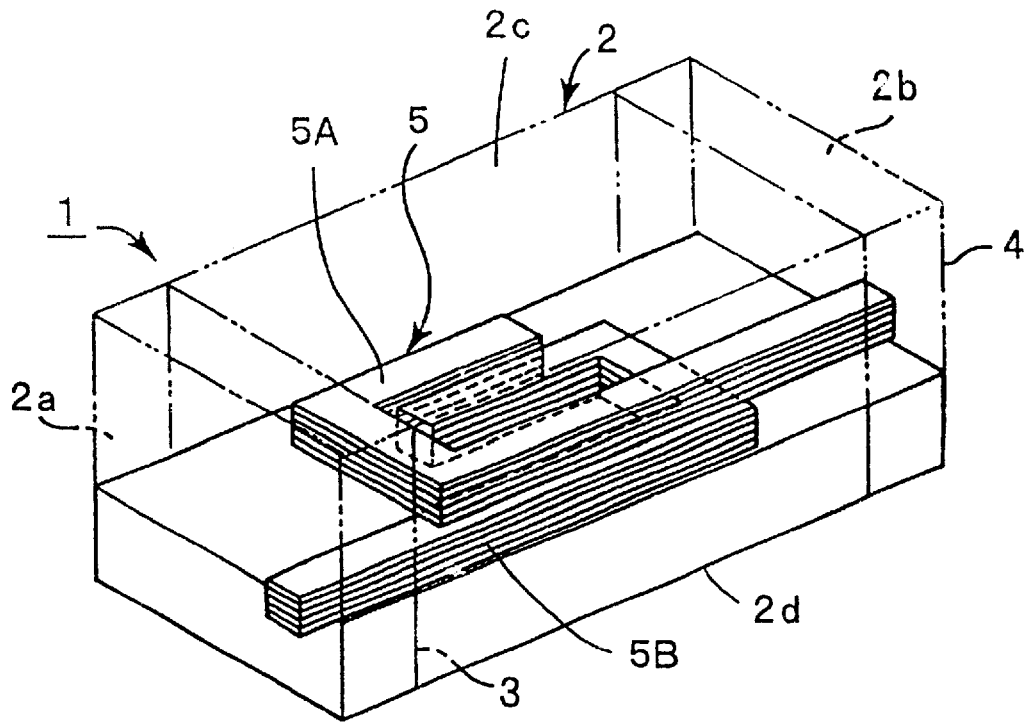
FIG. 2A is a schematic perspective view of the laminated inductor according to the first preferred embodiment of the present invention, for illustrating a coil conductor therein.
Figure 2B:
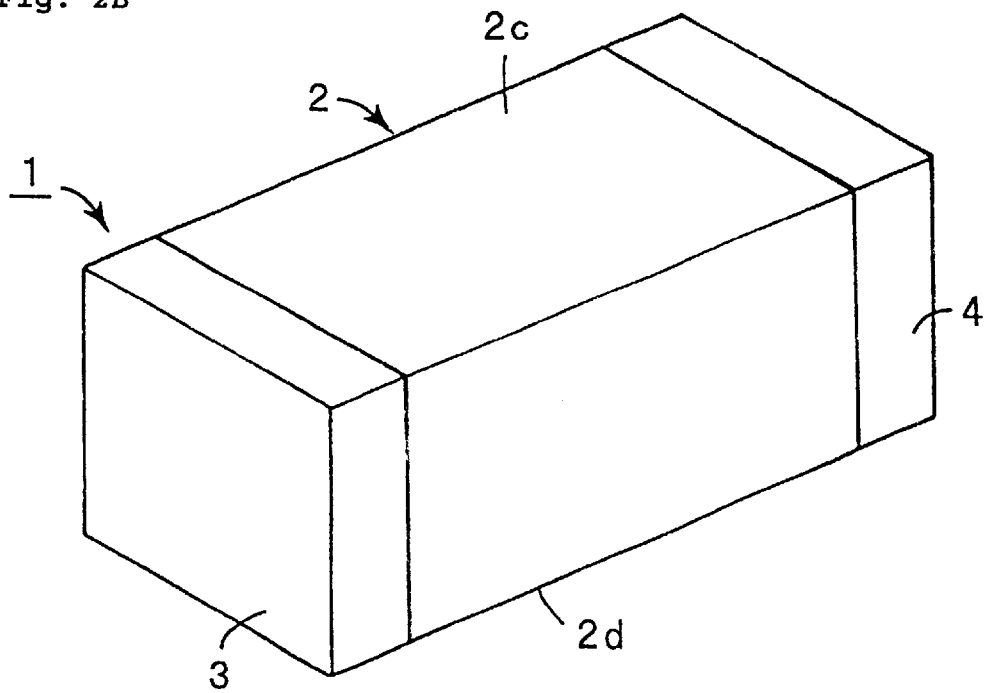
FIG. 2B is a perspective view of the laminated inductor according to the first preferred embodiment of the present invention.

FIG. 2A is a perspective view schematically showing the internal configuration of a laminated inductor 1 and FIG. 2B is an external perspective view of the laminated inductor 1.

FIGS. 2A and 2B further show a ceramic sintered body 2, a first end surface 2a of the sintered body 2 (hereinafter referred to as the first end surface 2a), a second end surface 2b of the sintered body 2 (hereinafter referred to as the second end surface 2b), an upper surface 2c of the sintered body 2 (hereinafter referred to as the upper surface 2c), a lower surface 2d of the sintered body 2 (hereinafter referred to as the lower surface 2d), a first external electrode 3, a second external electrode 4, and a coil conductor 5 including a first coil conductor 5A and a second coil conductor 5B.

The laminated inductor 1 includes the ceramic sintered body 2 which preferably has a substantially rectangular shape. The ceramic sintered body 2 includes a magnetic ceramic such as ferrite, or an insulating ceramic such as a glass ceramic. However, a magnetic ceramic is preferable for preferred embodiments of the present invention.

The first external electrode 3 and the second external electrode 4 are formed so as to cover the first end surface 2a and the second end surface 2b. The coil conductor 5 is formed in the ceramic sintered body 2. As shown in FIG. 2A, one end of the coil conductor 5 is exposed at the first end surface 2a, and is electrically connected to the external electrode 3. The other end of the coil conductor 5 is exposed at the second end surface 2b, and is electrically connected to the external electrode 4.

Figure 1:
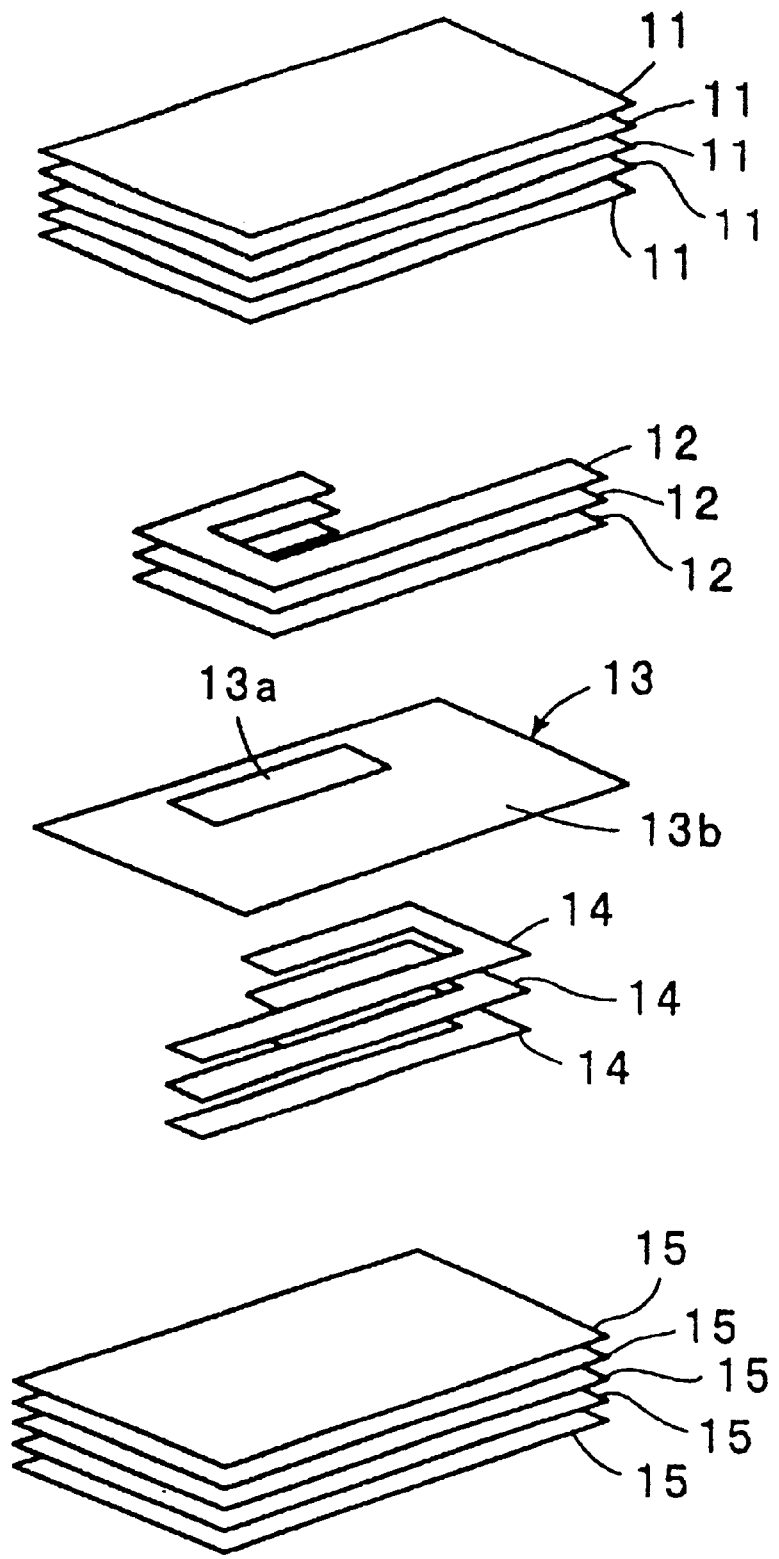
FIG. 1 is an exploded perspective view of ceramic green sheets, a composite sheet, and coil conductor layers, which are prepared for forming a laminated inductor according to a first preferred embodiment of the present invention.

In FIG. 1, a plurality of ceramic green sheets 11, a plurality of first coil conductor layers 12, a composite sheet 13 including a connecting conductor 13a and a ceramic green sheet 13b, a plurality of second coil conductor layers 14, and a plurality of ceramic green sheets 15 are shown, which form a green laminated body used for manufacturing the laminated inductor 1. The ceramic green sheets 11 and 15 are plain (dummy) ceramic green sheets for forming the uppermost layer and the lowermost layer of the ceramic sintered body 2. The first coil conductor layers 12 are laminated to form the first coil conductor 5A that is the upper portion of the coil conductor 5. The second coil conductor layers 14 are laminated to form the second coil conductor 5B that is the lower portion of the coil conductor 5. The connecting conductor 13a penetrates both surfaces of the ceramic green sheet 13b.

The connecting conductor 13a is positioned such that the upper surface thereof is electrically connected to one end of the first coil conductor layers 12, and the bottom surface thereof is electrically connected to one end of the second coil conductor layers 14, when the composite sheet 13 is laminated.

The width of the connecting conductor 13a is greater than the widths of the first coil conductor layers 12 and the second coil conductor layers 14.

Subsequently, the first coil conductor 5A which is placed on the connecting conductor 13a and the second coil conductor 5B which is placed under the connecting conductor 13a are electrically connected via the connecting conductor 13a, such that the coil conductor 5 shown in FIG. 2 is formed.

The first coil conductor layers 12 extend such that one end thereof is exposed at one end surface of the green laminated body. The second coil conductor layers 14 extend such that the other end thereof is exposed at the other end surface of the green laminated body.

Then, the green laminated body is fired to provide the ceramic sintered body 2 shown in FIGS. 2A and 2B. The first coil conductor 5A, which is defined by the first coil conductor layers 12, is exposed at the first end surface 2a of the ceramic sintered body 2, while the second coil conductor 5B, which is defined by the second coil conductor layers 14, is exposed at the second end surface 2b.

Next, the method of laminating the ceramic green sheets 11, the first coil conductor layers 12, the composite sheet 13, the second coil conductor layers 14, and the ceramic green sheets 15 will be described with reference to FIG. 3 and FIGS. 5A, 5B, 5C, 5D, 5E, and 5F.

In these drawings, carrier films 21, 23, and 24, and a lamination stage 22 are used for laminating the ceramic green sheets 15, the coil conductor 5B including the second coil conductor layers 14, and the composite sheet 13.

Figure 5A:
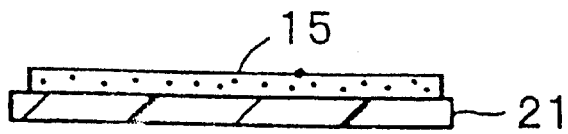
FIG. 5A is a cross sectional view illustrating a process step for laminating ceramic green sheets, each of which is held on a carrier film, coil conductor layers, and a composite sheet, according to the first preferred embodiment of the present invention.

First, the plurality of carrier films 21, each carrying the ceramic green sheet 15 thereon as shown in FIG. 5A, is prepared.

Figure 5B:
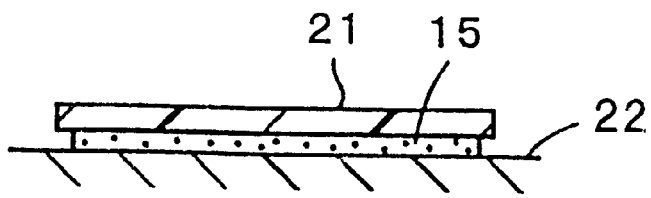
FIG. 5B is another cross sectional view illustrating the process step for laminating the ceramic green sheets, each of which is held on the carrier film, the coil conductor layers, and the composite sheet, according to the first preferred embodiment of the present invention.

Then, the ceramic green sheet 15 carried on the carrier film 21 is press-fitted on the lamination stage 22, as shown in FIG. 5B. Afterwards, the carrier film 21 is peeled off. That is to say, the ceramic green sheet 15 held on the carrier film 21 is laminated on the lamination stage 22 by a transferring method.

Figure 5C:
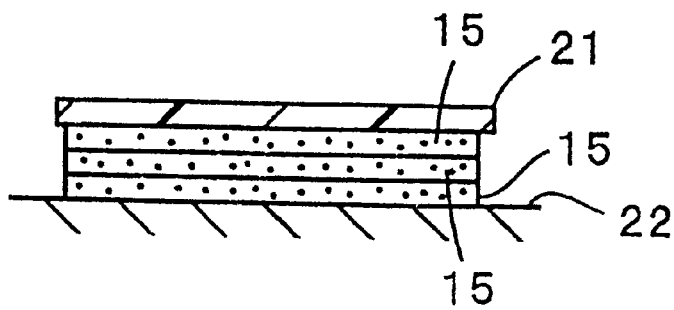
FIG. 5C is another cross sectional view illustrating the process step for laminating the ceramic green sheets, each of which is held on the carrier film, the coil conductor layers, and the composite sheet, according to the first preferred embodiment of the present invention.

The above-described laminating steps of the ceramic green sheets 15 are repeated a plurality of times, whereby the plurality of ceramic green sheets 15 are laminated as shown in FIG. 5C.

Figure 3:
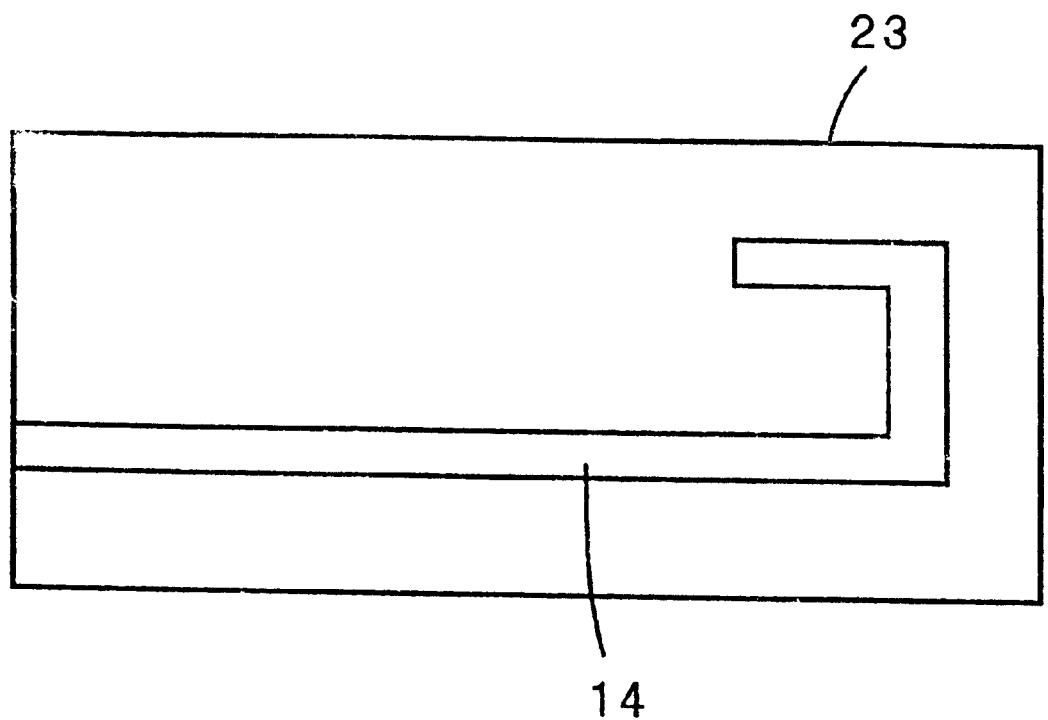
FIG. 3 is a plan view of a transfer material including a carrier film on which a coil conductor layer is formed according to the first preferred embodiment of the present invention.
Figure 5D:
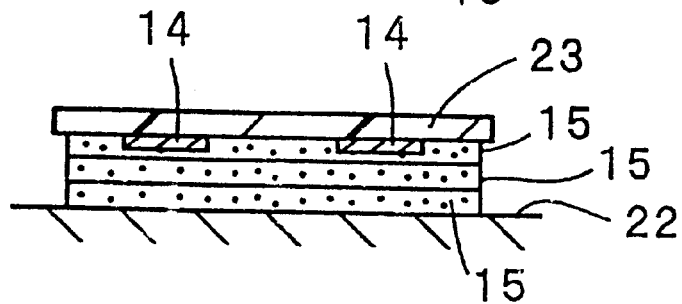
FIG. 5D is another cross sectional view illustrating the process step for laminating the ceramic green sheets, each of which is held on the carrier film, the coil conductor layers, and the composite sheet, according to the first preferred embodiment of the present invention.

Then, a transfer material including the second coil conductor layer 14 held on the carrier film 23 is prepared as shown in FIG. 3. The second coil conductor layer 14 held on the carrier film 23 is press-fitted on the laminated ceramic green sheets 15 by the same transferring method as shown in FIG. 5D, whereby the second coil conductor layer 14 is pressed in the ceramic green sheets 15. Afterwards, the carrier film 23 is peeled off. That is to say, the second coil conductor layers 14 are laminated by the transferring method, such that the patterns thereof are aligned in the same direction.

Figure 5E:
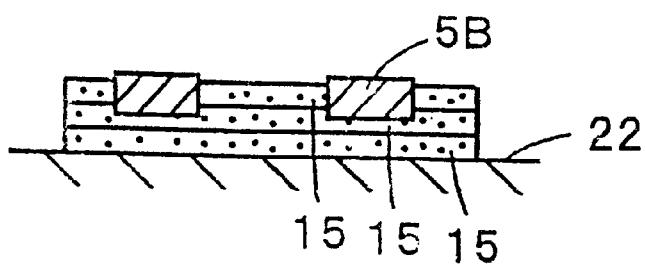
FIG. 5E is another cross sectional view illustrating the process step for laminating the ceramic green sheets, each of which is held on the carrier film, the coil conductor layers, and the composite sheet, according to the first preferred embodiment of the present invention.

The laminating steps of the second coil conductor layer 14 are repeated a plurality of times, whereby the plurality of the coil conductor layers 14 is laminated. Subsequently, the second coil conductor 5B is formed as shown in FIG. 5E. As shown in the same drawing, the upper portion of the coil conductor 5B is pressed into the laminated ceramic green sheets 15, and protrudes from the upper surface thereof.

In FIG. 5E, the shape of the cross section of the coil conductor 5B is preferably substantially rectangular. Alternatively, the cross section may have an elliptical shape, or the corners thereof may be rounded, or may have another suitable configuration.

Figure 5F:
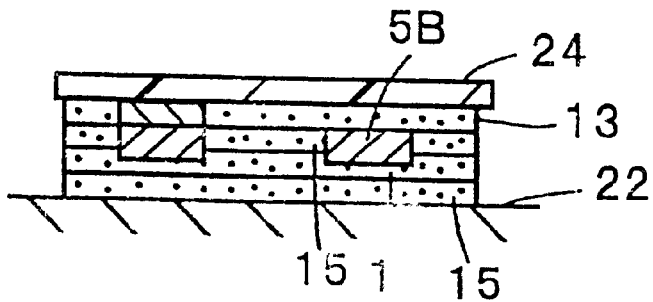
FIG. 5F is another cross sectional view illustrating the process step for laminating the ceramic green sheets, each of which is held on the carrier film, the coil conductor layers, and the composite sheet, according to the first preferred embodiment of the present invention.

In FIG. 5F, the composite sheet 13 held on the carrier film 24 is laminated on the coil conductor 5B including the second coil conductor layers 14 by the transferring method. More specifically, the composite sheet 13 is laminated and press-fitted on the coil conductor 5B such that the connecting conductor 13a overlaps one end of the coil conductor 5B. Afterwards, the carrier film 24 is peeled off.

Then, the first coil conductor layers 12, which form the coil conductor 5A, are laminated by using the same transferring method as in the case of the second coil conductor layers 14. Further, the ceramic green sheets 11 are laminated by the same transferring method as in the case of the above-described ceramic green sheets 15.

Figure 6:
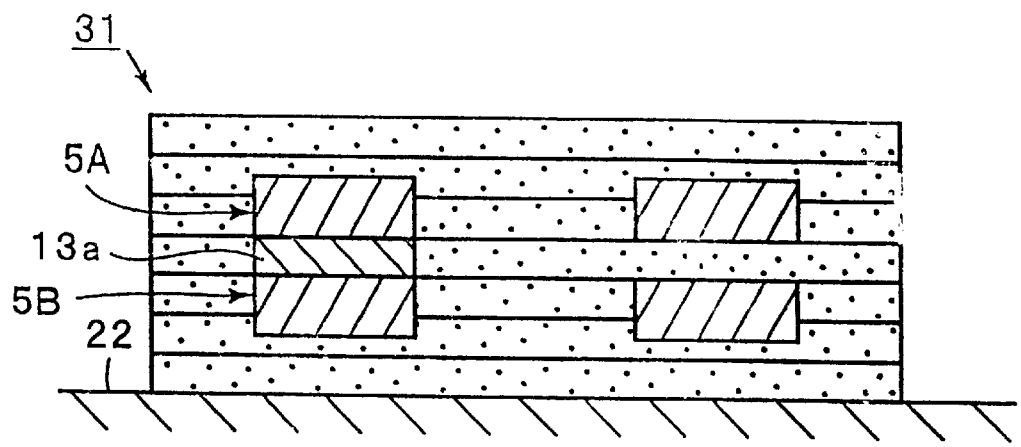
FIG. 6 is a cross sectional view illustrating a green laminated body obtained by the laminating processes according to the first preferred embodiment of the present invention.

Accordingly, a green laminated body 31 shown in FIG. 6 is obtained. In the green laminated body 31, the first coil conductor 5A is provided on the connecting conductor 13*a*, and the second coil conductor 5B is provided thereunder. The coil conductors 5A and 5B are electrically connected to each other via the connecting conductor 13*a*.

By firing the green laminated body 31, the ceramic sintered body 2 shown in FIGS. 2A and 2B is obtained.

Then, the external electrode 3 is formed on the first end surface 2*a* on the ceramic sintered body 2, and the external electrode 4 is formed on the second end surface 2*b* on the ceramic sintered body 2 by performing a suitable process, such as applying and baking conductive paste. Thus, the laminated inductor 1 is formed.

According to the first preferred embodiment, the coil conductor 5A having a large thickness is formed by laminating the plurality of first coil conductor layers 12, and the coil conductor 5B having a large thickness is formed by laminating the plurality of second coil conductor layers 14. Accordingly, the coil conductor 5 is provided, which has a large thickness, a low series resistance, and a large inductance.

Figure 4A:
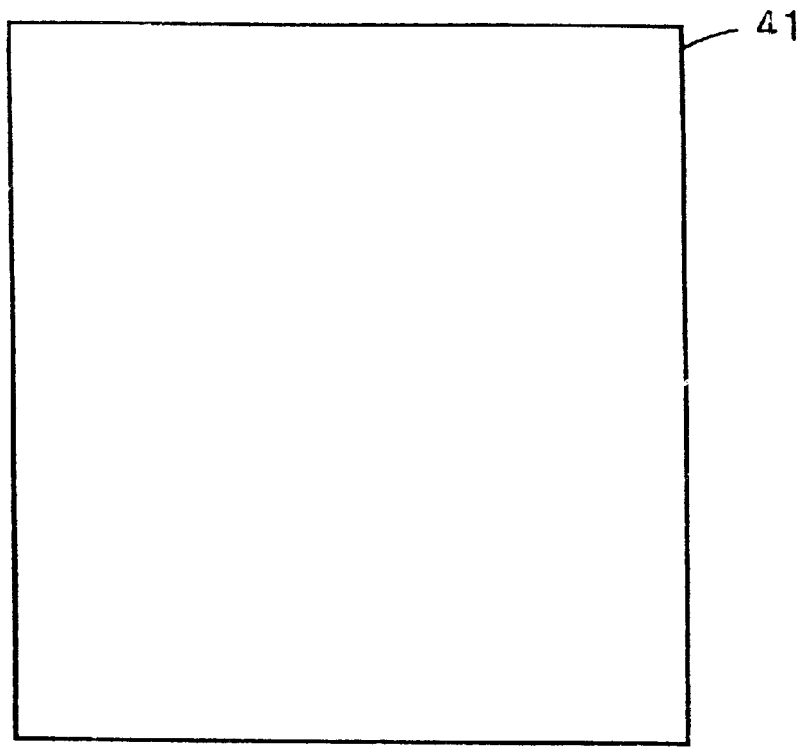
FIG. 4A is a plan view of a mother-carrier film according to a second preferred embodiment of the present invention.
Figure 4B:
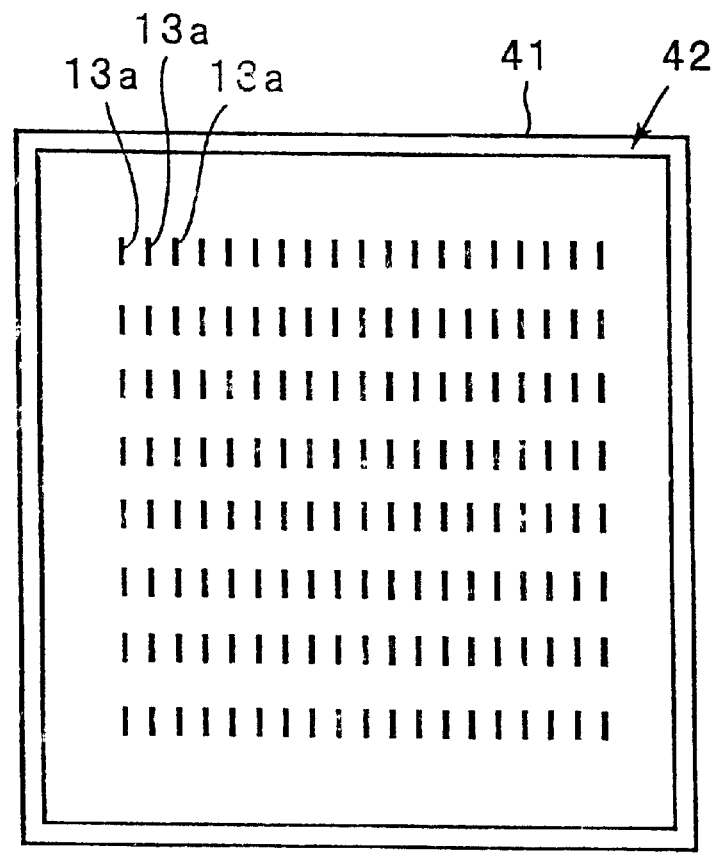
FIG. 4B is a plan view of a mother-composite sheet formed on the mother-carrier film according to the second preferred embodiment of the present invention.

A method of manufacturing a laminated inductor according to a second preferred embodiment of the present invention will now be described with reference to FIGS. 4A and 4B. In the first preferred embodiment, the steps for obtaining one green laminated body 31 have been described. In practice, however, the green laminated body 31 can be obtained by splitting a mother green laminated body, formed as a composite of many green laminated bodies, into a single green laminated body. For obtaining the mother green laminated body, a plurality of mother carrier films 41 shown in FIG. 4A is prepared. Then, a mother ceramic green sheet that functions as the ceramic green sheet 11 or the ceramic green sheet 15 provided on the mother carrier film 41, a mother composite sheet 13 provided on the mother-carrier film 41, and the plurality of first coil conductors 12 or the plurality of second coil conductors 14 aligned in a matrix on the mother carrier film 41 are prepared. For example, as shown in FIG. 4B, the plurality of connecting conductors 13*a* is provided and aligned in a matrix to define a mother composite sheet 42.

For obtaining the mother composite sheet 42, the plurality of connecting conductors 13*a* is printed on the mother carrier film 41 by screen printing or other suitable method. Then, one ceramic green sheet is printed on the mother carrier film 41 except at the positions where the connecting conductors 13*a* are printed, whereby a mother ceramic green sheet 42*b* is achieved. Accordingly, the mother composite sheet 42 is provided.

Additionally, penetrating holes may be provided in a mother ceramic green sheet, at the positions where the connecting conductors 13*a* are to be provided. Subsequently, the penetrating holes may be filled with conductive paste to form the connecting conductors 13*a*.

In order to laminate them, the plurality of first conductor layers 12 and the plurality of second conductor layers 14 are printed on the mother carrier films 41, which are prepared in the above described manner, by screen printing or other suitable method. These conductor layers, which are printed on the mother carrier films 41, are aligned in a matrix.

Figure 7:
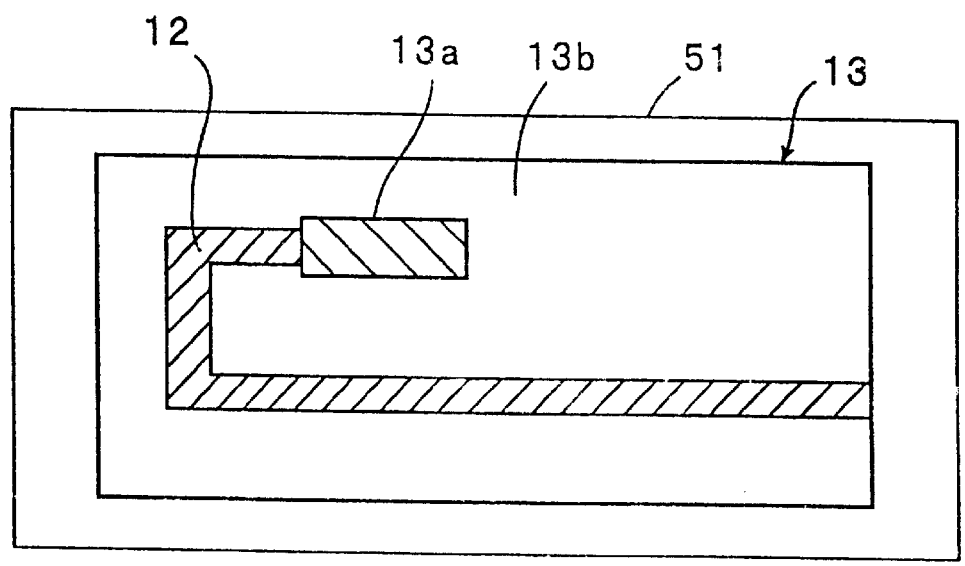
FIG. 7 is a plan view of a transfer material including a carrier film on which a coil conductor layer and a composite sheet are laminated, according to a third preferred embodiment of the present invention.

A method of manufacturing a laminated inductor according to a third preferred embodiment of the present invention will now be described with reference to FIG. 7. In the first and second preferred embodiments, the first coil conductor layers 12 are laminated after the composite sheet 13 is laminated. However, in this preferred embodiment, the composite sheet 13 includes the lowermost of first coil conductor layers 12 and the connecting conductor 13*a* thereon. For example, the composite sheet 13, which includes the lowermost of first coil conductor layers 12 and the connecting conductor 13*a* that are connected to each other, is provided on a carrier film 51 as shown in FIG. 7. Thus, the composite sheet 13, which includes the lowermost first coil conductor layer 12 and the connecting conductor 13*a*, is provided on the carrier film 51, whereby a transfer material 52 is obtained. By using the transfer material 52, the composite sheet 13 and one coil conductor layer 12 are transferred at the same time.

In these preferred embodiments, one kind of the coil conductor layers 12 and 14 are laminated on and under the connecting conductor 13*a*. However, a plurality of kinds of coil conductor layers may further be laminated to form a coil conductor with an increased number of windings.

Figure 8:
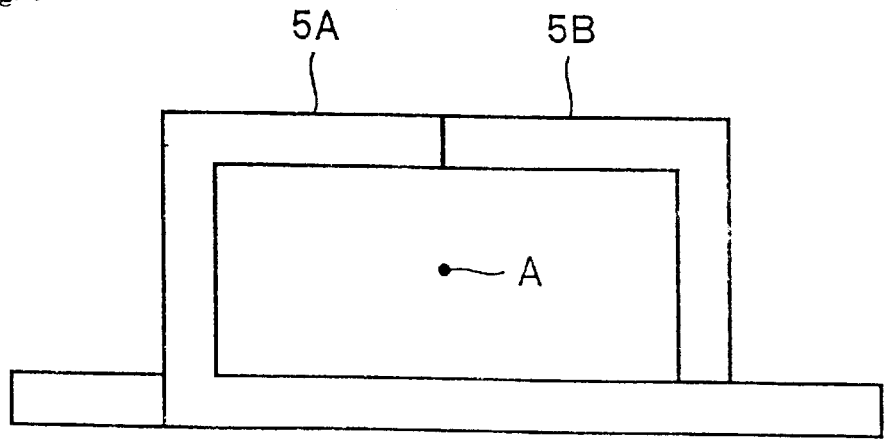
FIG. 8 is a schematic plan view illustrating the shape of the coil conductor of the laminated inductor according to the first, second, and third preferred embodiments of the present invention.

Further, in these preferred embodiments, the coil conductor 5A and the coil conductor 5B are provided such that the winding portions thereof are symmetric with respect to the plane including point A which corresponds to the center of the winding, as schematically shown in FIG. 8.

Also, in these preferred embodiments, the winding direction of the coil conductor 5A defined by the first coil conductor layers 12 is the same as the coil conductor 5B defined by the second coil conductor layers 14, whereby a large inductance is achieved.

In these preferred embodiments, the coil conductor 5A that is laminated onto the composite sheet 13, and the coil conductor 5B that is laminated under the composite sheet 13 are connected by the connecting conductor 13*a* which is provided on the composite sheet 13. However, the composite sheet is unnecessary when the coil conductor 5 is provided in the following manner. First, the plurality of second coil conductor layers 14 is laminated. Then, the plurality of first coil conductor layers 12, which is configured in a desired pattern that is suitable for electrical connection to the second coil conductor layers 14, is laminated by the transferring method.

Figure 9:
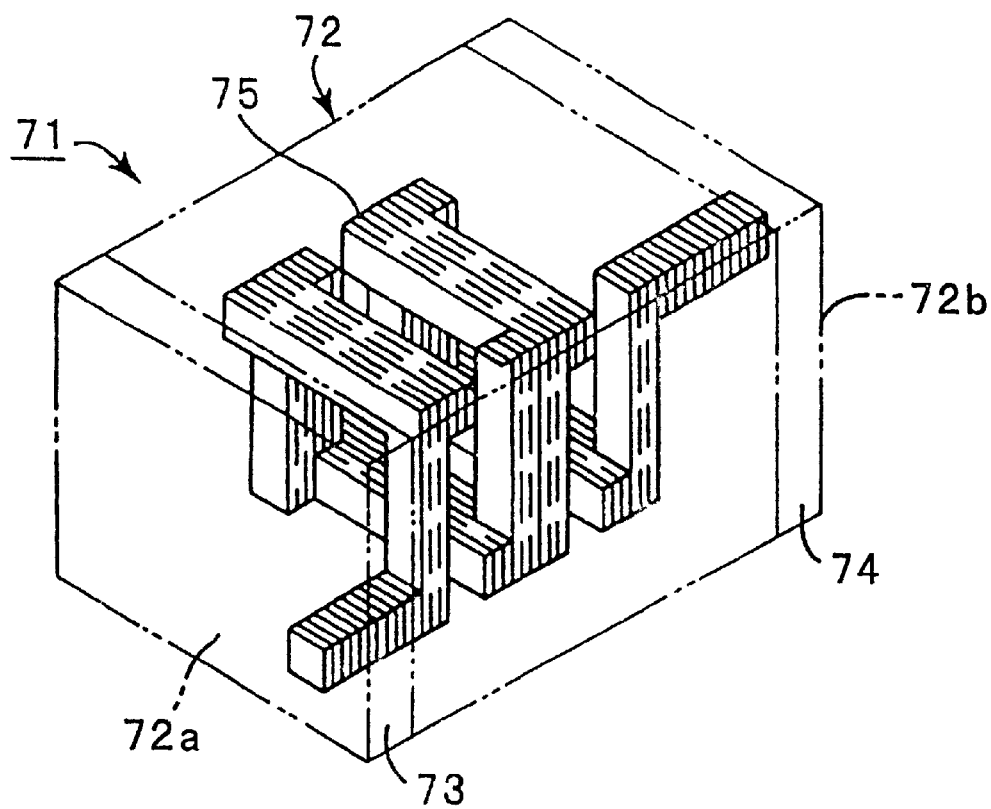
FIG. 9 is a schematic perspective view illustrating a laminated inductor according to a fourth preferred embodiment of the present invention.

A method of manufacturing a laminated inductor according to a fourth preferred embodiment of the present invention will now be described with reference to FIG. 9. In the above-described preferred embodiments, the external electrode 3 is formed on the first end surface 2*a*, and the external electrode 4 is formed on the second end surface 2*b*. Further, the coil conductor 5 winds in a downward direction from the upper surface 2*c* to the lower surface 2*d*. However, in this preferred embodiment, a laminated inductor 71 is provided that includes a ceramic sintered body 72 having end surfaces 72*a* and 72*b*, external electrodes 73 and 74, and a coil conductor 75, as shown in FIG. 9. The external electrodes 73 and 74 are respectively provided on the end surfaces 72*a* and 72*b*. The coil conductor 75 winds from the end surface 72*a* to the end surface 72*b*. That is, the laminated inductor 71 includes the coil conductor 75 that winds in a horizontal direction.

In the above-described preferred embodiments, the methods of manufacturing the laminated inductors have been described. However, the present invention can be applied to manufacture other laminated ceramic electronic components such as a laminated varistor, a laminated thermistor, a laminated capacitor, a laminated LC filter, a multilayered substrate, and a laminated circuit module. Since the present invention allows for an increase in thickness of an internal electrode, any laminated ceramic electronic component, which is manufactured according to the methods of the present invention, achieves a large inductance and an increased current-carrying capacity.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of manufacturing a laminated ceramic electronic component comprising the steps of:

preparing a first ceramic green sheet having an upper surface and a lower surface, at least one second ceramic green sheet, and transfer materials each having a conductor layer on one surface of a carrier film;

transferring a plurality of the conductor layers onto at least one of the upper surface and the lower surface of the first ceramic green sheet such that the conductor layers overlay one another to form a conductor having the plurality of the conductor layers;

laminating said at least one second ceramic green sheet onto the conductor to form a green laminated body; and firing the green laminated body to form a sintered body.

2. A method of manufacturing a laminated ceramic electronic component according to claim 1, wherein one of the first ceramic green sheet and the at least one second ceramic green sheet is a composite sheet having a connecting conductor that penetrates both surfaces thereof, and the other is a plain ceramic green sheet.

3. A method of manufacturing a laminated ceramic electronic component according to claim 1, wherein said at least one second ceramic green sheet is a plain ceramic green sheet.

4. A method of manufacturing a laminated ceramic electronic component according to claim 1, wherein said laminated ceramic electronic component is a laminated ceramic inductor.

5. A method of manufacturing a laminated ceramic electronic component according to claim 1, wherein said step of laminating said at least one second ceramic green sheet onto the conductor to form a green laminated body includes the steps of laminating a first second ceramic green sheet onto the conductor layers on the upper surface of the first ceramic green sheet, and laminating a second ceramic green sheet onto the conductor layers on the lower surface of the first ceramic green sheet.

6. A method of manufacturing a laminated ceramic electronic component comprising the steps of:

preparing at least one ceramic green sheet, a composite sheet having a connecting conductor that penetrates both surfaces thereof, and transfer materials each having a conductor layer, which is to be connected to the connecting conductor, onto one surface of a carrier film;

transferring a plurality of the conductor layers onto the composite sheet such that the conductor layers overlay one another to form a conductor which is connected to the connecting conductor and which has the plurality of the conductor layers;

laminating said at least one ceramic green sheet onto the conductor to form a green laminated body; and firing the green laminated body to form a sintered body.

7. A method of manufacturing a laminated ceramic electronic component according to claim 6, further comprising the step of laminating the conductor onto the upper surface and the lower surface of the composite sheet such that one of said conductors is electrically connected to the upper portion of the connecting conductor and the other conductor is electrically connected to the lower portion of the connecting conductor, wherein the conductor connected to the upper portion of the connecting conductor and the other conductor connected to the lower portion of the connecting conductor are electrically connected via the connecting conductor.

8. A method of manufacturing a laminated ceramic electronic component according to claim 6, wherein said at least one ceramic green sheet is a plain ceramic green sheet.

9. A method of manufacturing a laminated ceramic electronic component according to claim 6, wherein said laminated ceramic electronic component is a laminated ceramic inductor.

10. A method of manufacturing a laminated ceramic electronic component comprising the steps of:

preparing a plurality of first ceramic green sheets, a second ceramic green sheet having a connecting conductor that penetrates both surfaces thereof, and a plurality of transfer materials each having a conductor layer on one surface of a carrier film;

transferring a first of said conductor layers onto one surface of one of said first ceramic green sheets by using pressure, and transferring a second of said conductor layers thereon by using pressure such that the conductor layers overlay one another;

laminating the second ceramic green sheet onto the first and second conductor layers that are transferred onto the first ceramic green sheet such that the connecting conductor is connected to the first and second conductor layers;

transferring a third of said conductor layers onto the second ceramic green sheet by using pressure such that the connecting conductor is connected to the third conductor layer, and transferring a fourth of said conductor layers thereon by using pressure such that the third and fourth conductor layers overlay one another;

laminating another of said plurality of first ceramic green sheets onto the second ceramic green sheet to form a green laminated body; and firing the green laminated body to form a sintered body.

11. A method of manufacturing a laminated ceramic electronic component according to claim 10, wherein said another of said plurality of first ceramic green sheets is a plain ceramic green sheet.

12. A method of manufacturing a laminated ceramic electronic component according to claim 10, wherein said laminated ceramic electronic component is a laminated ceramic inductor.

13. A method of manufacturing a laminated inductor comprising the steps of:

preparing a composite sheet having a connecting conductor that penetrates both surfaces of a ceramic green sheet, transfer materials each having a coil conductor layer that is to be connected to the connecting conductor on one surface of a carrier film, and at least one plain ceramic green sheet;

transferring a plurality of said coil conductor layers onto the composite sheet such that the plurality of coil conductor layers overlay one another to form a coil conductor which is electrically connected to the connecting conductor and which includes the plurality of coil conductor layers;

laminating said at least one plain ceramic green sheet onto the coil conductor to form a laminated body; and firing the green laminated body to form a sintered body.

14. A method of manufacturing a laminated inductor according to claim 13, further comprising the steps of:

transferring the plurality of coil conductor layers of the transfer materials onto an upper surface of the composite sheet; and transferring another plurality of said coil conductor layers of the transfer materials onto a lower surface of the composite sheet, wherein a first coil conductor defined by the plurality of coil conductor layers is formed on the connecting conductor and a second coil conductor defined by said another plurality of coil conductor layers is formed under the connecting conductor.

15. A method of manufacturing a laminated inductor according to claim 14, wherein the first coil conductor and the second coil conductor wind in the same direction.

16. A method of manufacturing a laminated ceramic electronic component according to claim 13, wherein said laminated ceramic electronic component is a laminated ceramic inductor.

* * * * *